United States Patent
Tsai

(10) Patent No.: US 7,772,034 B2
(45) Date of Patent: Aug. 10, 2010

(54) FABRICATION METHOD OF SEMICONDUCTOR DEVICE

(75) Inventor: Shiann-Tsong Tsai, Hsinchu (TW)

(73) Assignee: UTAC (Taiwan) Corporation, Hsin-chu (TW)

( * ) Notice: Subject to any disclaimer, the term of this patent is extended or adjusted under 35 U.S.C. 154(b) by 201 days.

(21) Appl. No.: 12/075,936

(22) Filed: Mar. 14, 2008

(65) Prior Publication Data
US 2009/0111221 A1    Apr. 30, 2009

(30) Foreign Application Priority Data
Oct. 31, 2007    (TW) .............................. 96140924 A

(51) Int. Cl.
*H01L 21/00* (2006.01)
(52) U.S. Cl. ................... 438/108; 438/124; 257/778; 257/E21.503
(58) Field of Classification Search ............ 257/735, 257/736, 738, 775, 778, E21.503; 438/108, 438/118, 127, 124
See application file for complete search history.

(56) References Cited

U.S. PATENT DOCUMENTS

| | | | |
|---|---|---|---|
| 2007/0262439 A1* | 11/2007 | Huang et al. ................. | 257/692 |
| 2007/0278655 A1* | 12/2007 | Gonzalez et al. ............ | 257/690 |
| 2008/0157333 A1* | 7/2008 | Lin et al. ..................... | 257/687 |
| 2008/0274589 A1* | 11/2008 | Lee et al. ..................... | 438/108 |

* cited by examiner

*Primary Examiner*—Tu-Tu V Ho
(74) *Attorney, Agent, or Firm*—Peter F. Corless; Steven M. Jensen; Edwards Angell Palmer & Dodge LLP

(57) ABSTRACT

A fabrication method of semiconductor device includes providing a substrate which has a plurality of electrical connection pads and is covered with an insulative layer, wherein the insulative layer has an opening formed for exposing the electrical connection pads; forming a filling material on the insulative layer of the substrate and compressing a semiconductor chip to the substrate through a plurality of bumps, the bumps electrically connecting the electrical connection pads and the filling material filling spacing between the semiconductor chip and the substrate so as to form a filling layer. By replacing the conventional underfilling process with the preprinting process of the filling material, the fabrication cost of the semiconductor device is reduced and the fabrication process is simplified.

6 Claims, 6 Drawing Sheets

FABRICATION METHOD OF SEMICONDUCTOR DEVICE

BACKGROUND OF THE INVENTION

1. Field of the Invention

The present invention relates generally to a fabrication method of semiconductor devices, and more particularly to a fabrication method of flip chip semiconductor devices.

2. Description of Related Art

Different from a conventional wire bonding package structure, semiconductor chip of a flip chip package structure is mounted upside down to the substrate and electrically connected with the substrate through a plurality of bumps. Thus, the whole package structure becomes much smaller and thinner and meanwhile electrical performance thereof is improved.

FIGS. 1A to 1D show a fabrication method of a conventional flip chip package structure.

As shown in FIG. 1, a substrate 1 and a semiconductor chip 2 are provided, wherein the substrate 1 has a first surface 10 with a plurality of electrical connection pads 11, and the semiconductor chip 2 has an active surface 20 and a non-active surface 21, the active surface 20 having a plurality of bumps 22.

As shown in FIG. 1B, the semiconductor chip 2 is mounted upside down to the substrate 1 with the bumps 22 electrically connected with the electrical connection pads 11.

As shown in FIG. 1C, an underfilling process is performed so as to fill a filling material 23 between the active surface 20 of the semiconductor chip 2 and the first surface 10 of the substrate 1.

As shown in FIG. 1D, a molding process is performed such that an encapsulant 24 can be formed on the non-active surface 21 of the chip 2 and the first surface 10 of the substrate 1 to encapsulate the chip 2, the bumps 22 and the first surface 10 of the substrate 1.

By electrically connecting the bumps 22 of the chip 2 with the electrical connection pads 11 of the substrate 1, the above-described flip chip package structure achieves preferred electrical connection quality. However, the underfilling process is rather complicated, which adversely affects the efficiency of the fabrication process.

According to the above-described drawback, another fabrication method of a flip chip package structure is shown in FIGS. 2A to 2C.

As shown in FIG. 2A, a substrate 3 and a semiconductor chip 4 are provided. The substrate 3 has a first surface 30 with a plurality of electrical connection pads 31. An anisotropic conductive paste/film (ACP/ACF) is attached to the first surface 30, thereby forming a bonding layer 32 having conductive particles 321. The semiconductor chip 4 has an active surface 40 and a non-active surface 41, the active surface 40 having a plurality of bumps 42.

As shown in FIG. 2B, the semiconductor chip 4 is mounted upside down to the substrate 3 with the bumps 42 electrically connected with the electrical connection pads 31 through the conductive particles 321.

As shown in FIG. 2C, a molding process is performed such that an encapsulant 43 can be formed on the non-active surface 41 of the semiconductor chip 4 and the first surface 30 of the substrate 3 so as to encapsulate the semiconductor chip 4, the bumps 42 and the first surface 30 of the substrate 3.

Although the fabrication method can avoid the underfilling process by using the ACP/ACF, the ACP/ACF is quite expensive, which accordingly increases the fabrication cost and is not cost-effective.

In addition, when the ACP/ACF is used, the first surface 30 must be roughened to strengthen the bonding between the semiconductor chip 4 and the substrate 3, thereby complicating the fabrication process.

Therefore, how to improve electrical connection between the semiconductor chip and the substrate while simplifying the fabrication process and reducing the fabrication cost has become critical.

SUMMARY OF THE INVENTION

According to the above drawbacks, an objective of the present invention is to provide a fabrication method of semiconductor device with simplified fabrication process.

Another objective of the present invention is to provide a fabrication method of semiconductor device enabling mass production of semiconductor devices.

A further objective of the present invention is to provide a fabrication method of semiconductor device that reduces the material cost and is cost-effective.

In order to attain the above and other objectives, the present invention provides a fabrication method of a semiconductor device, which comprises the steps of: providing a substrate and a semiconductor chip, wherein, the substrate has a first surface with a plurality of electrical connection pads and the first surface is covered with an insulative layer, the insulative layer has an opening formed to expose the electrical connection pads, and the semiconductor chip has an active surface with a plurality of bumps and a non-active surface; forming a filling material on the first surface of the substrate; and compressing the semiconductor chip to the substrate with the bumps electrically connected with the electrical connection pads, the filling material filling gaps between the semiconductor chip and the substrate so as to form a filling layer.

The fabrication method further comprises forming an encapsulant on surface of the insulative layer and the non-active surface of the semiconductor chip so as to encapsulate the semiconductor chip and the bumps; the compression method is one of thermal compression and thermosonic compression; the filling material is a printable B-stage underfill/die attaching material, which is disposed on the first surface of the substrate by printing, spray coating or spin coating and is heated to obtain B-stage characteristic.

In one embodiment, the method of forming the filling material comprises the steps of: disposing a template on the insulative layer on the first surface of the substrate, wherein the template has at least two openings formed to expose surface of the insulative layer and the two openings are respectively located at two sides of the opening of the insulative layer; forming a filling material in the openings of the template; and removing the template so as to form the filling material on the insulative layer and expose the opening of the insulative layer of the substrate and then heating and baking the filling material. Then, the filling material is heated and baked to become B-stage. Side of the filling material facing the opening of the insulative layer has a tip end formed at central portion thereof so as to make the filling material flow quickly towards the opening.

According to another embodiment, the method of forming the filling material comprises the steps of: disposing a template on the insulative layer on the first surface of the substrate, wherein the template has an opening formed to expose part of surface of the insulative layer and the electrical connection pads in the opening of the insulative layer of the substrate; forming a filling material in the opening of the template; and removing the template so as to form the filling material on the insulative layer and in the opening of the insulative layer of the substrate. The filling material is then heated and baked to become B-stage.

Preferably, the above-described fabrication method can be applied in fabricating DDR DRAMs (Double Data Rate Dynamic Random Access Memories), especially DDR III and DDR IV.

In addition, as the filling material is a printable B-stage underfill/die attaching material having preferable adhesive characteristic, preferred bonding can be formed between the semiconductor chip and the substrate through the filling material without the need of roughening the first surface of the substrate.

The present invention pre-coats the filling material such as B-stage underfill/chip attaching material on the insulative layer of the substrate and when the semiconductor chip is bonded to the substrate, the filling material fills gaps between the semiconductor chip and the substrate and is solidified to form a filling layer, thereby avoiding the conventional underfilling process. In addition, the filling material is much cheaper than the conventional anisotropic conductive paste/film (ACP/ACF). Thus, the present invention reduces the material cost and is suitable to be applied in mass production of semiconductor devices.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

FIGS. 3A to 3H are diagrams showing a fabrication method of semiconductor device according to a first embodiment of the present invention.

Figure 1A:
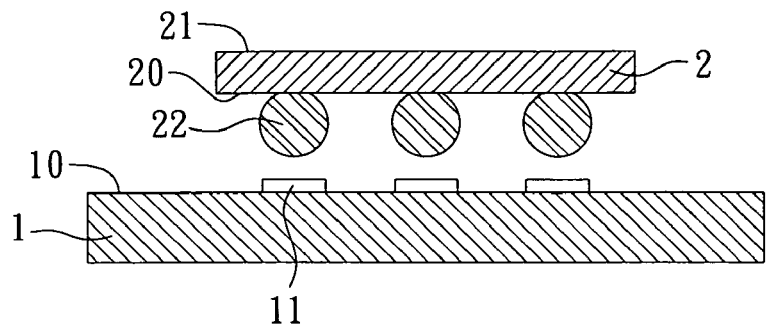
FIGS. 1A to 1D are diagrams showing a conventional fabrication method of semiconductor device.
Figure 1B:
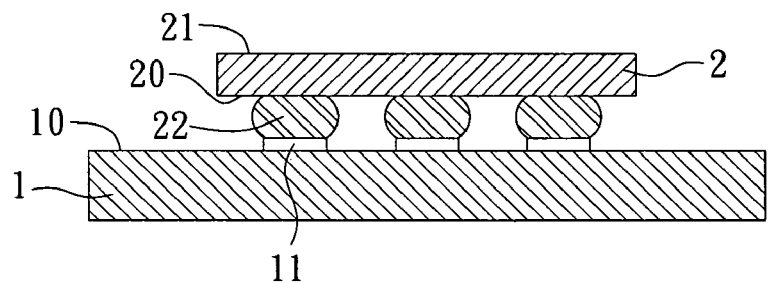
Figure 1C:
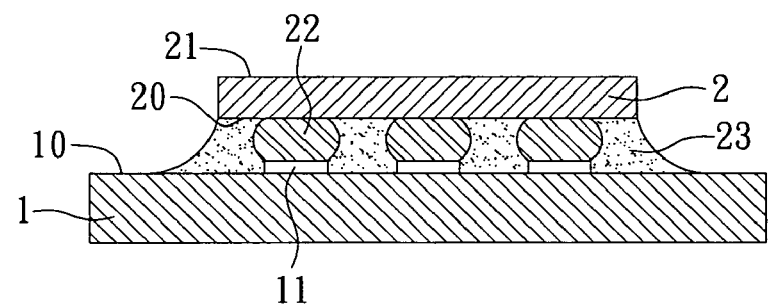
Figure 1D:
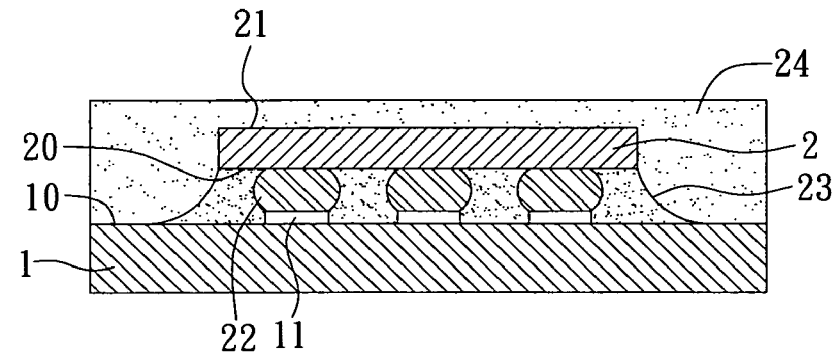
Figure 2A:
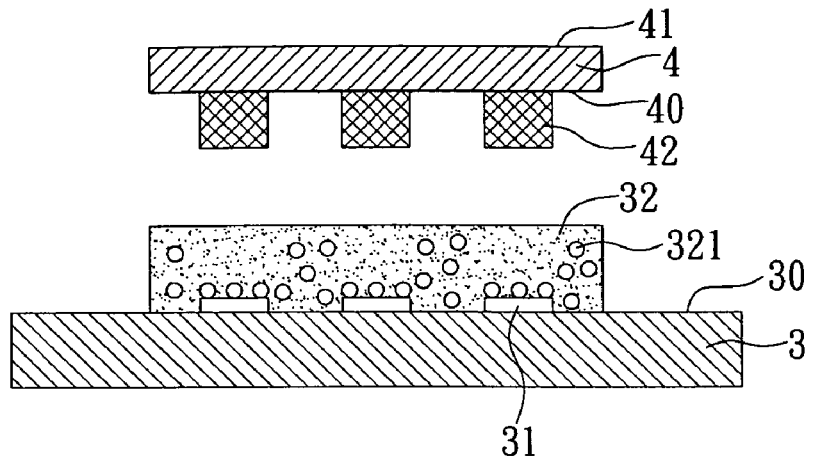
FIGS. 2A to 2C are diagrams showing another conventional fabrication method of semiconductor device.
Figure 2B:
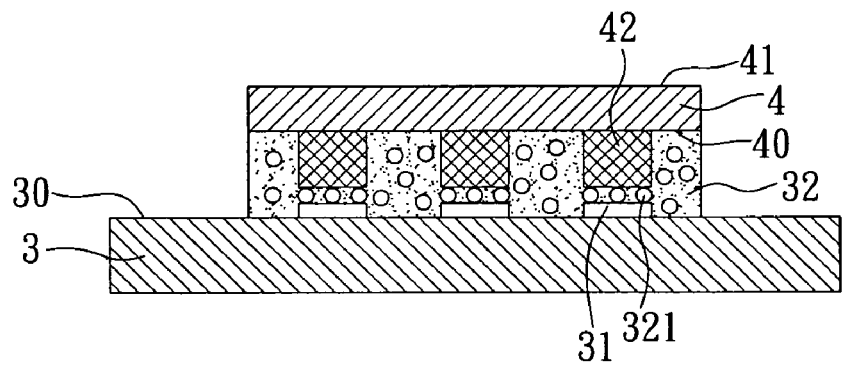
Figure 2C:
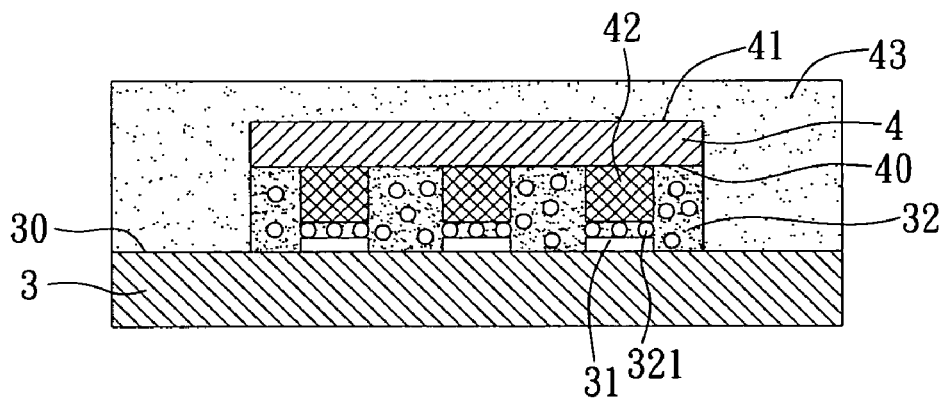
Figure 3A:
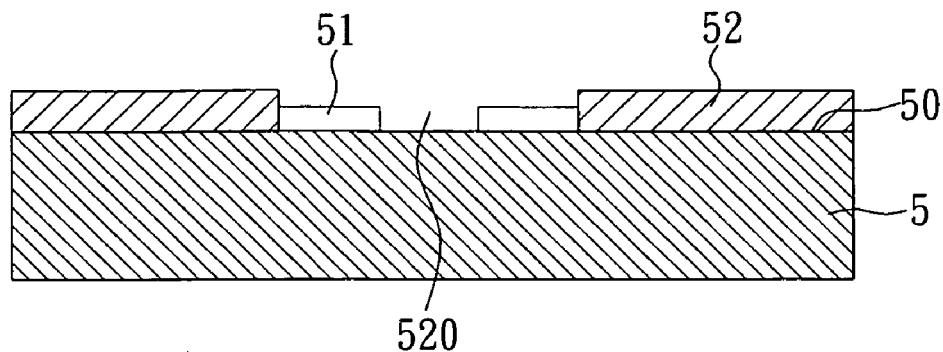
FIGS. 3A to 3H are diagrams showing a fabrication method of semiconductor device according to a first embodiment of the present invention.

As shown in FIG. 3A, a substrate 5 is provided, which has a first surface 50 with a plurality of electrical connection pads 51. The first surface 50 is covered with an insulative layer 52 and an opening 520 is formed in the insulative layer 52 to expose the electrical connection pads 51.

Figure 3B:
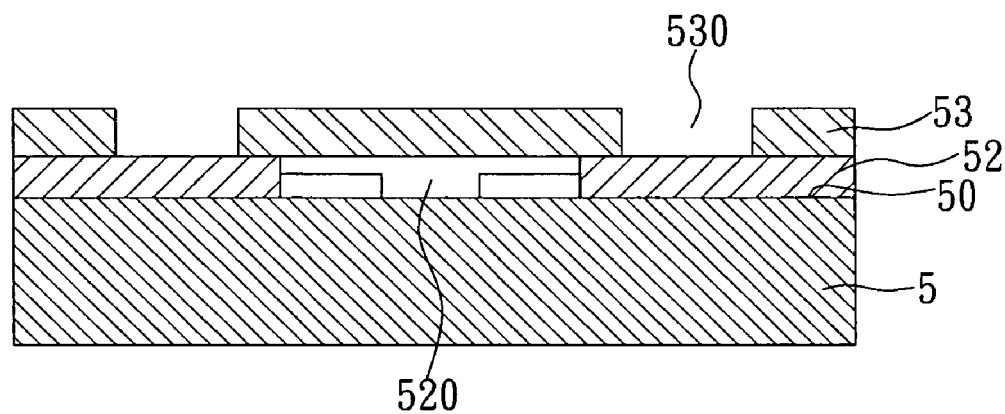

As shown in FIG. 3B, a template 53 is disposed on the insulative layer 52 and at least two openings 530 are formed in the template 53 to expose part of surface of the insulative layer 52. Therein the two openings 530 are located at two sides of the opening 520.

Figure 3C:
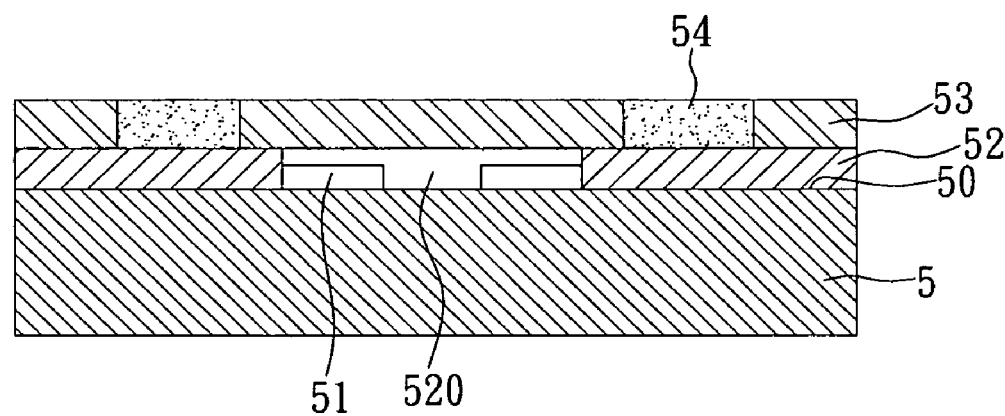

As shown in FIG. 3C, a filling material 54 such as printable B-stage underfill/die attaching material is filled in the openings 530 by printing.

Figure 3D:
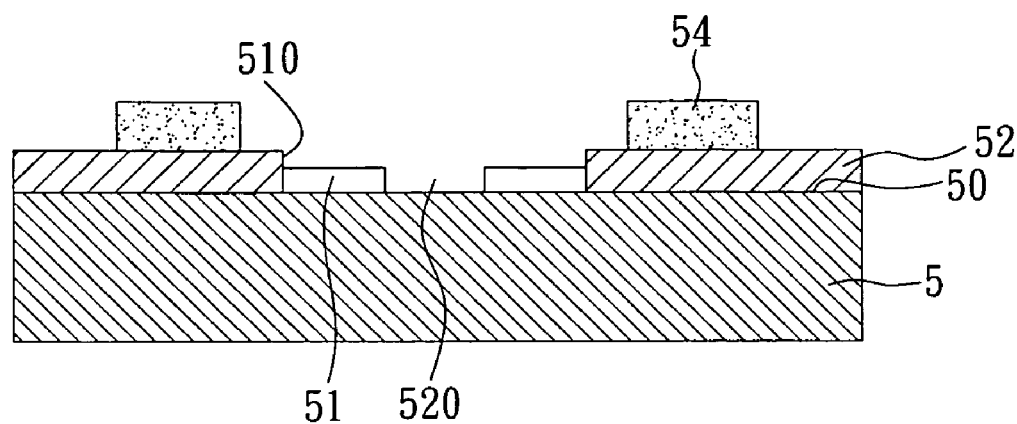
Figure 3E:
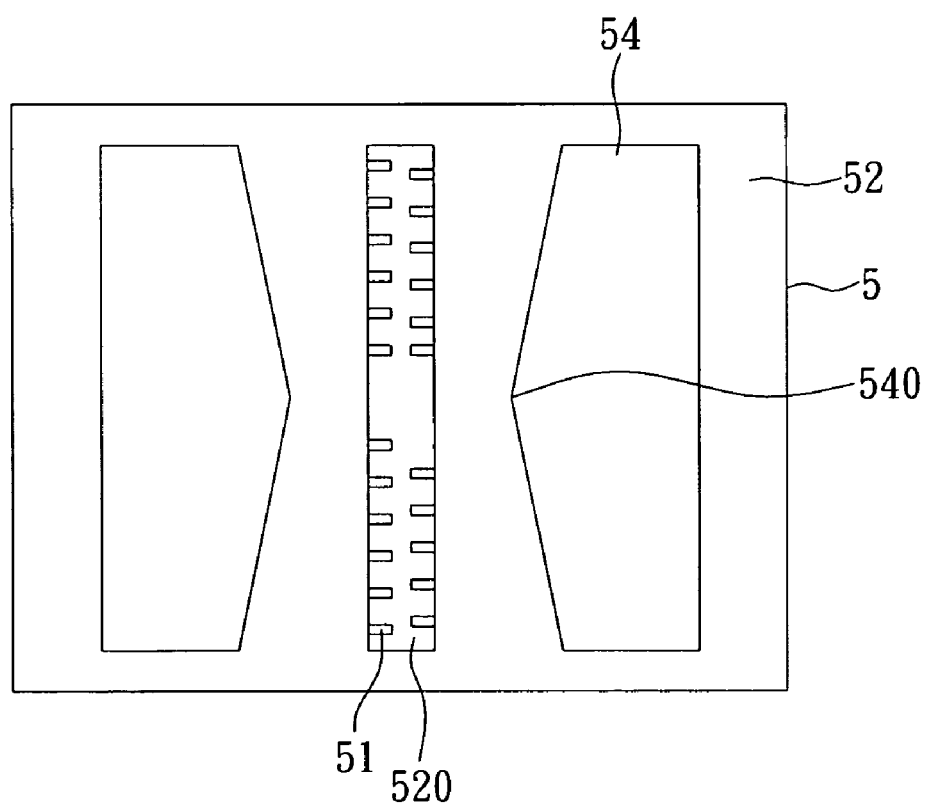

As shown in FIGS. 3D and 3E, the template 53 is removed so as to form the filling material 54 on the insulative layer 52 and expose the opening 520. The filling material 54 is further heated and baked to form B-stage, wherein the filling material 54 is located at two sides of the opening 520 and side of the filling material 54 facing the opening 520 has a tip end 540 formed at central portion thereof.

Figure 3F:
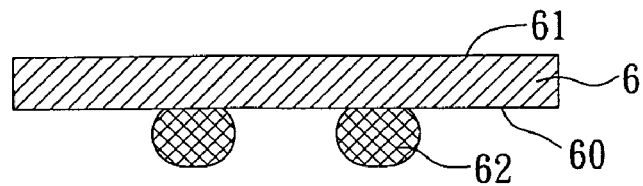

As shown in FIG. 3F, a semiconductor chip 6 is provided, which has an active surface 60 and a non-active surface 61. The active surface 60 of the semiconductor chip 6 has a plurality of bumps 62 formed corresponding to the electrical connection pads 51.

Figure 3G:
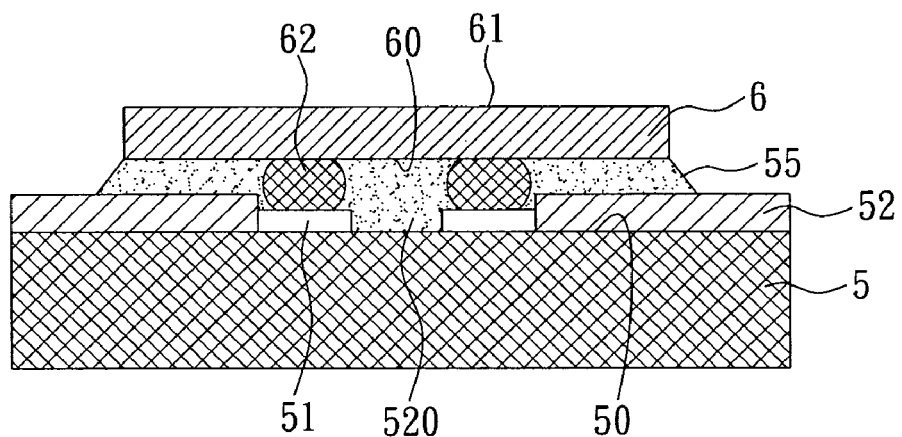

As shown in FIG. 3G, the semiconductor chip 6 is bonded to the substrate 5 by thermal compression or thermosonic compression with the bumps 52 being connected to the electrical connection pads 51. Meanwhile, under pressure and heat as well as guide of the tip end 540, a large portion of the filling material 54 flows quickly toward the opening 520, and fills the openings 520. The air in the opening 520 is dissipated out from position where the filling material 54 is not disposed. When the filling material 54 fills the opening 520 and is solidified between the chip 6 and the substrate 5, a filling layer 55 is formed.

Figure 3H:
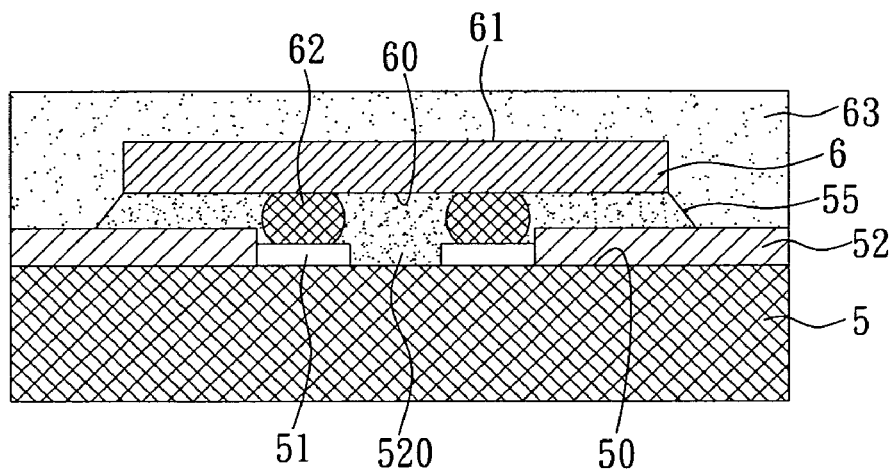

As shown in FIG. 3H, a molding process is performed such that an encapsulant 63 is formed on surface of the insulative layer 52 and the non-active surface 61 of the semiconductor chip 6 for encapsulating the chip 6 and the bumps 62.

The above-described fabrication method can be applied in fabricating DDR DRAM (Double Data Rate Dynamic Random Access Memory), especially fabricating DDR III and DDR IV.

Through the bumps 62 and the electrical connection pads 51, a preferred electrical connection between the semiconductor chip 6 and the substrate 5 can be achieved. Meanwhile, the filling material 54 this is compressed by the chip 6 and the substrate 5 fills gaps between the chip 6 and the substrate 5 and is solidified to form the filling layer 55. Accordingly, the conventional underfilling process can be avoided, thereby simplifying the fabrication process of the semiconductor device and reducing the fabrication cost.

The filling material 54 is a B-stage underfill/die attaching material that has a preferred adhesive characteristic. Thus, the first surface 50 of the substrate 5 does not need to be roughened and a preferred bonding between the substrate 5 and the chip 6 can be achieved. In addition, the filling material 54 is much cheaper than the anisotropic conductive paste/film (ACP/ACF).

FIGS. 4A to 4D are diagrams showing a fabrication method of semiconductor device according to a second embodiment of the present invention. The present embodiment is similar to the first embodiment except the difference in regions for disposing of the filling material.

Figure 4A:
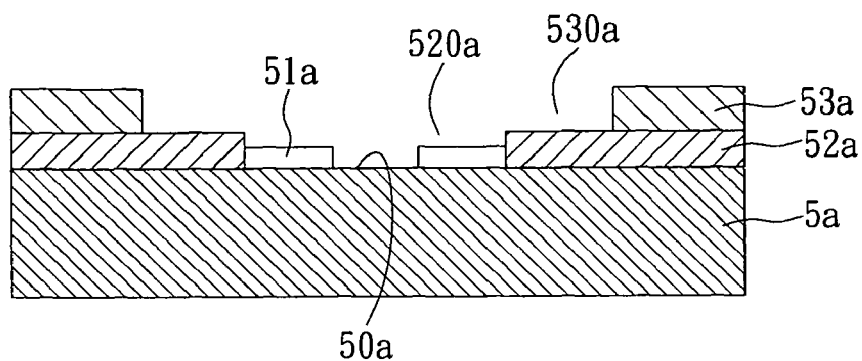
FIGS. 4A to 4D are diagrams showing a fabrication method of semiconductor device according to a second embodiment of the present invention.

As shown in FIG. 4A, similar to the first embodiment, a substrate 5a is provided, which has a first surface 50a with a plurality of electrical connection pads 51a and an insulative layer 52a. An opening 520a is formed in the insulative layer 52a to expose the electrical connection pads 51a. A template 53a is disposed on the insulative layer 52a and an opening 530a is formed in the template 53a to expose part of surface of the insulative layer 52a and expose the electrical connection pads 51a in the openings 520a.

Figure 4B:
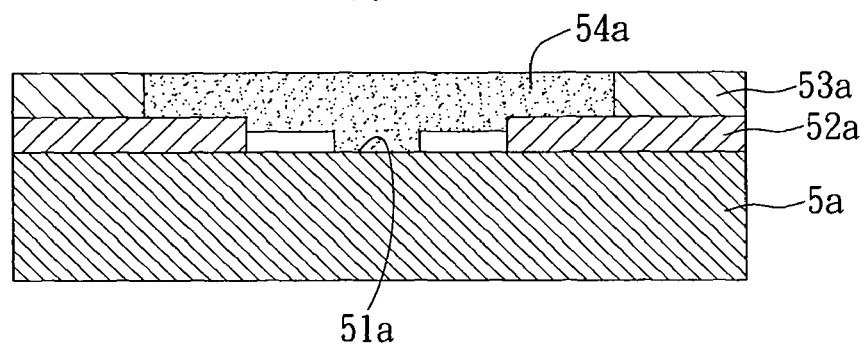

As shown in FIG. 4B, a filling material 54a is formed in the opening 530a of the template 53a by printing so as to cover part of surface of the insulative layer 52a and fill the opening 520a.

Figure 4C:
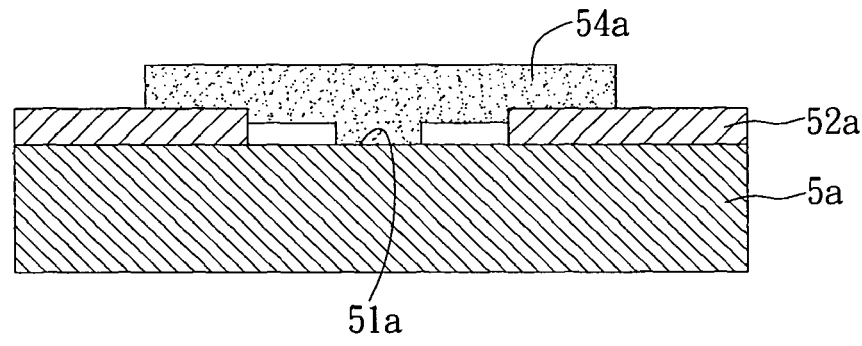

As shown in FIG. 4C, the template 53a is removed and the filling material 54a is heated and baked (B-stage bake).

Figure 4D:
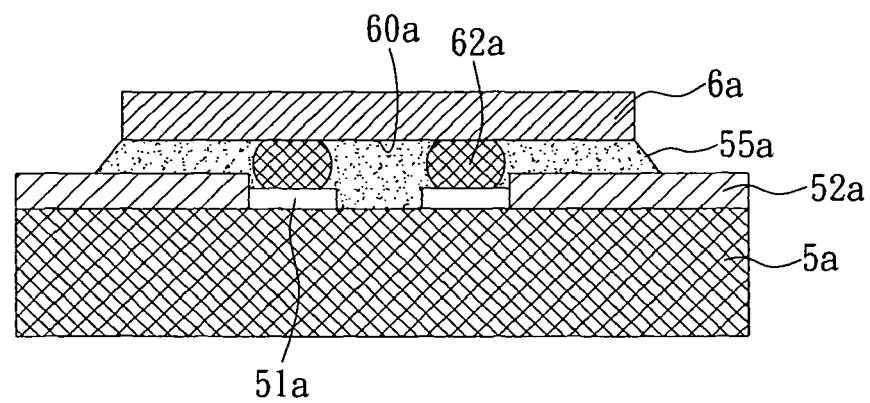

As shown in FIG. 4D, a semiconductor chip 6a with bumps 62a formed on an active surface 60a thereof is compressed to the substrate 5a with the bumps 62a connected to the electrical connection pads 51a. Meanwhile, by heat and pressure, the filling material 54a is filled between the chip 6a and the substrate 5a and solidified to form a filling layer 55a. Subsequently, a molding process is performed (not shown).

Therefore, the present invention avoids the conventional underfilling process by pre-coating the filling material 54, 54a such as B-stage underfill/chip attaching material on the insulative layer of the substrate. In addition, the filling material 54, 54a is much cheaper than the conventional anisotropic conductive paste/film (ACP/ACF). Thus, the present invention is suitable to be applied in mass production of semiconductor devices and is cost-effective.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor device, comprising the steps of:
   providing a substrate and a semiconductor chip, wherein the substrate has a first surface with a plurality of electrical connection pads, and the first surface is covered with an insulative layer, the insulative layer having an opening formed to expose the electrical connection pads, and the semiconductor chip having an active surface with a plurality of bumps and a non-active surface;
   forming a filling material on the first surface of the substrate; and
   compressing the semiconductor chip to the substrate with the bumps electrically connected with the electrical connection pads, the filling material filling gaps between the semiconductor chip and the substrate, thereby obtaining the semiconductor device,
   wherein the step of forming the filling material comprises the steps of:
   disposing a template on the insulative layer on the first surface of the substrate, wherein the template has at least two openings formed to expose a surface of the insulative layer and the two openings are respectively located at two sides of the opening of the insulative layer;
   forming the filling material in the openings of the template; and
   removing the template so as to form the filling material on the insulative layer and expose the opening of the insulative layer of the substrate, and then heating and baking the filling material, wherein a side of the filling material facing the opening of the insulative layer has a tip end formed at a central portion thereof so as to make the filling material flow quickly towards the opening.

2. The method of claim 1 further comprising forming an encapsulant on surface of the insulative layer and the non-active surface of the semiconductor chip so as to encapsulate the semiconductor chip and the bumps.

3. The method of claim 1, wherein the filling material becomes B-stage after being heated and baked.

4. The method of claim 1, wherein the compression method is one of thermal compression and thermosonic compression.

5. The method of claim 1, wherein the filling material is a printable B-stage underfill/die attaching material.

6. The method of claim 1, wherein the semiconductor device is a DDR DRAM (Double Data Rate Dynamic Random Access Memory).

* * * * *